United States Patent
Dunn et al.

(10) Patent No.: US 6,258,695 B1
(45) Date of Patent: Jul. 10, 2001

(54) DISLOCATION SUPPRESSION BY CARBON INCORPORATION

(75) Inventors: James Dunn, Jericho; Peter Geiss, Underhill; Stephen St. Onge, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/244,959

(22) Filed: Feb. 4, 1999

(51) Int. Cl.$^7$ .................................................. H01L 21/762

(52) U.S. Cl. ........................... 438/424; 438/528; 438/702

(58) Field of Search .................................. 438/423, 424, 438/528, 520, FOR 158, FOR 227, 700, 702

(56) References Cited

U.S. PATENT DOCUMENTS

| | | |
|---|---|---|
| 3,622,382 | 11/1971 | Brack et al. . |
| 5,024,723 | 6/1991 | Goesele et al. . |
| 5,212,101 | 5/1993 | Canham et al. . |
| 6,013,546 * | 1/2000 | Gardner et al. . |
| 6,025,273 * | 2/2000 | Chen et al. . |

FOREIGN PATENT DOCUMENTS

| | | |
|---|---|---|
| 4-10544 | 1/1992 | (JP) . |
| 4-155829 | 5/1992 | (JP) . |
| 8-288215 | 11/1996 | (JP) . |

OTHER PUBLICATIONS

R. Beck et al; Effect of Carbon on Thermal Oxidation . . .; Journ of Elec. Mat. vol. 22, No. 6 pp. 689–694.
R. Yankov et al.; Proximity Gettering of Copper . . .; Nucl. Inst. and Meth in Phy. Res.; B120 1996 pp. 60–63.
S. Isomae et al.; Annealling Behavior of MeV Implanted . . . J. App. Phys. vol. 74, No. 6, Sep. 15, 1993; pp. 3815–3820.
D. Eaglesham et al; Defects in Ion–Implanted Si: . . . Intr. Phys. Conf. Ser. No. 146; Mar. 20, 1995; pp. 451–457.
J. Liefting et al; Time Evolution of Dislocation . . . Mat. Science and Eng. B25 (1994) pp. 60–67.
J. Liefting et al; C Implantation for Suppression . . . Mat. Res. Soc. Symp Proc. vol. 235; 1992 pp. 179–184.
T. Ando et al.; Reduction of P–N Junction . . .; Optoelec. Tech. Res. Lab Japan; pp. 659–666, (Date Unknown).
S. Im, et al.; Reducing Disloation Density . . .; pp. 139–143, (Date Unknown).
T. Simpson et al.; Suppression of Dislocation Formation in Silicon . . . publ. Aug. 29, 1995; pp. 37–38.
R. Liefting et al; Improved Device performance by . . . .; IEEE Trans. on Elec. Devices; vol. 41, No. Jan. 1994, pp. 39–44.
L. Lanzerotti, et al; Suppression of Boron Outdiffusino in . . .; IEEE, 1996; IEDM96–249; pp. 45–47.
P. Stolk et al; The Effect of Carbon on Diffusion in Silicon; Mat. Science and Eng. B36 (1996) 275–281.
A. Cacciato et al.; Dislocation Formation and B Transient . . . J. Appl. Phys. 79, (5), Mar. 1, 1996; pp. 2314–2325.

(List continued on next page.)

Primary Examiner—George Fourson
(74) Attorney, Agent, or Firm—McGuireWoods, LLP; William D. Sabo

(57) ABSTRACT

A method of reducing the formation of silicon crystal defects due to extrinsic stresses in an integrated circuit chip. The source of such extrinsic stresses may be filling trenches with polycrystalline silicon or oxide, silicides, forming silicon nitride spacers or liners, or during oxide birds-beak formation, or at numerous other processing points. At an appropriate point, as each sensitive feature is defined or formed, carbon co-implanted into the silicon wafer at or near the feature.

7 Claims, 3 Drawing Sheets

OTHER PUBLICATIONS

N. Cowern et al; Role of C and B Clusters . . . . Appl. Phys. Lett., vol. 68, No. 8 Feb. 19, 1996; pp. 1150–1152.

P. Stolk et al; Carbon Incorporation in Silicon for Suppressing . . . .; Apply. Phys. Lett 66 (11), Mar. 13, 1995; pp. 1370–1372.

P. Stolk et al; Understanding and Controlling . . . ; Mat. Res. Soc. Symp. Proc. vol. 354; 1995; pp. 307–318.

C. Chang et al; The Effect of Carbon on the Valence . . .; Appl. Phys. Lett. No. 70 (12) Mar. 24, 1997 pp. 1557–1559.

M. Antonelli et al; The Effects of Rapid Recrystallization . . . Mat. Res. Soc. Symp. Proc. vol. 379, pp. 453–459, 1995.

* cited by examiner

DISLOCATION SUPPRESSION BY CARBON INCORPORATION

BACKGROUND OF THE INVENTION

1. Field of the Invention

The present invention generally relates to semiconductor manufacturing processes and more particularly to silicon semiconductor or nano-machine device manufacturing processes.

2. Background Description

Semiconductor manufacturing processes are complex multi-step processes during which compressive or tensile stresses are formed in crystalline structure of the semiconductor wafers or substrates. Often, crystalline dislocations form in the substrate to relieve these high stresses. These crystalline dislocations can cause junction leakage, enhanced diffusion, metal precipitation sites, and other undesirable effects.

Junction leakage can severely reduce dynamic random access memory (DRAM) retention time. Enhanced diffusion causes what is referred to as bipolar pipes. Metal precipitation sites cause shorted junctions.

U.S. Pat. No. 5,441,901 to Candelaria entitled "Carbon Incorporation in a Bipolar Base for Bandgap Modification" teaches the use of carbon in the base region of a bipolar transistor for the purpose of bandgap modification for improved bipolar device performance. Carbon has been combined with typical semiconductor dopants such as Boron, Phosphorous, Arsenic, etc., and co-implanted in silicon to minimize transient enhanced diffusion (TED) that might otherwise occur upon post implantation annealing. Also, carbon has been combined with these dopants to minimize the formation of end-of-range (EOR) implant dislocations at post implantation annealing.

Co-implantation of carbon in these instances is to prevent implant related dislocation damage, as well as transient enhanced diffusion due to the creation of silicon self-interstitials by the implantation of the dopant species (as well as the carbon itself). The presence of the carbon causes the rapid extinction of the silicon self-interstitials upon recrystallization annealing, thereby preventing the formation of end-of-range dislocations, as well as, transient enhanced diffusion of the implanted dopant species.

FIG. 1 shows dislocations at the corners of oxide filled shallow trenches. These dislocations are due to compressive stresses in the oxide filled trenches that act on the surrounding silicon crystal lattice (external forces). $SiO_2$ compressive stress creates forces on surrounding silicon causing the creation of dislocations (d) at recessed oxide corners.

Deep carbon implants have been used to act as gettering sites for heavy metal contaminants in semiconductors. Substitutional carbon has been introduced into bipolar and FET SiGe regions to inhibit the formation of dislocations due to crystal lattice stresses. These crystal lattice stresses are caused by the incorporation of substitutional germanium into the silicon crystal lattice. Germanium, unlike carbon, is a larger atom than silicon and, when substituted for silicon in the crystal lattice at a sufficient concentration, it creates compressive stresses that can cause dislocation formation. Substitutional carbon has been included in these devices to relieve intrinsic stresses so as to prevent dislocation formation.

Thus, there is a need for reducing or eliminating external stress to prevent dislocation formation.

SUMMARY OF THE INVENTION

It is therefore a purpose of the present invention to prevent dislocation formation at features formed in a semiconductor layer.

It is yet another purpose of the present invention to prevent dislocation formation caused by external stresses at features formed on a silicon wafer.

The present invention is a method of reducing the effect of extrinsic stresses in an integrated circuit chip. Such extrinsic stresses may be caused by filling trenches with polycrystalline silicon or oxide, silicides, forming silicon nitride spacers or liners, or during oxide birds-beak formation, or at numerous other processing points. At an appropriate point, as each sensitive feature is defined or formed, carbon co-implanted into the silicon wafer at or near the feature.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
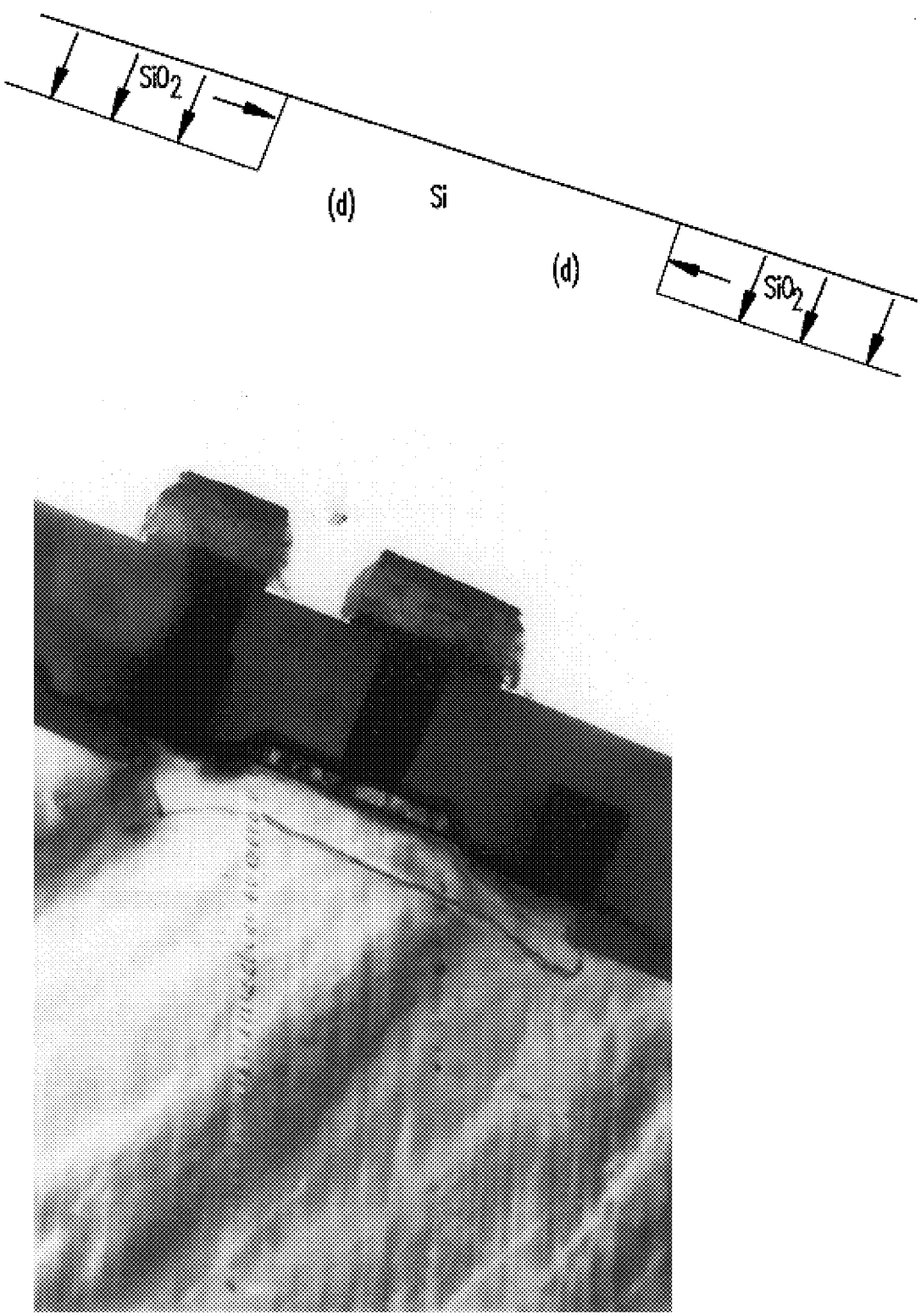
FIG. 1 shows dislocations coming off of the corners of oxide filled shallow trenches due to compressive stresses in the oxide filled trenches acting on the surrounding silicon crystal lattice (external forces)

Referring now to the drawings, and more particularly to FIGS. 2A–2F, which show the preferred steps in selectively implanting carbon into a silicon wafer, eliminate extrinsic stress is dramatically attenuated in this example in shallow trench isolation. So, in FIG. 2A, a thin pad oxide layer 102 is grown on silicon wafer 100. Preferably, pad oxide layer 102 is 80Å thick. A pad nitride layer 104 is formed on the pad oxide layer 102. Preferably, pad nitride layer 104 is 1200Å thick. The pad nitride layer 104 and oxide layer 102 are masked and etched to silicon wafer 100 to open areas 106 in FIG. 2B defining shallow trench isolation areas.

Figure 2A:
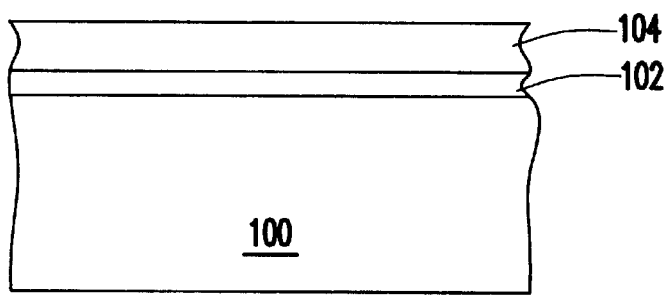
FIGS. 2A–2F represent the steps in implanting carbon in a silicon wafer to eliminate extrinsic stress in shallow trench isolation.
Figure 2B:
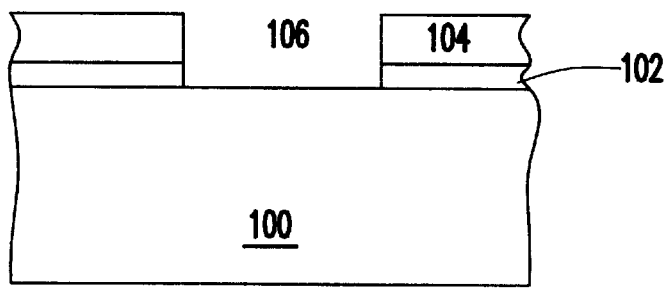
Figure 2C:
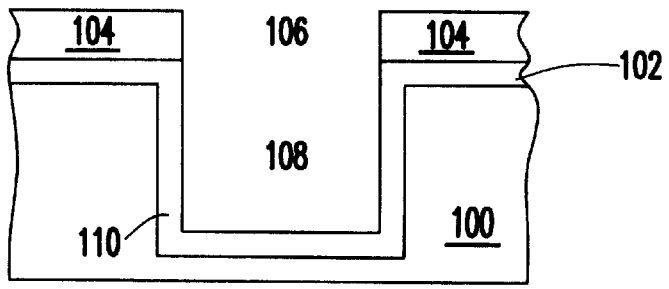
Figure 2D:
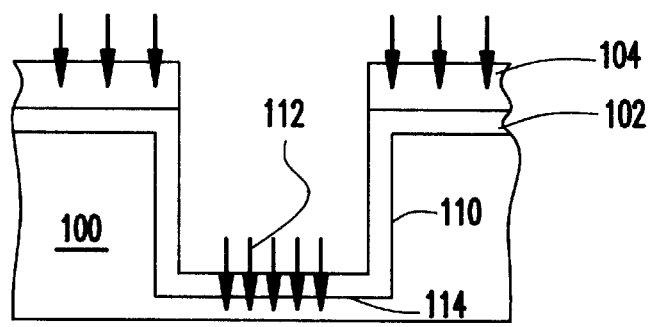

In FIG. 2C, shallow trenches 108 are etched into wafer 100. Preferably, shallow trenches 108 are 5000Å deep. A thin oxide layer 110 is formed on the silicon in the trenches 108. Preferably, the thin oxide layer 110 is 100Å thick. Carbon is implanted in FIG. 2D as represented by arrows 112. The carbon 112 is implanted with sufficient energy to penetrate the thin oxide layer 110 at the trench bottoms 114 and enter the silicon 100 thereunder, but with insufficient energy to penetrate both the pad nitride 104 and pad oxide 102. Thus, carbon is implanted into silicon wafer 100 only at the bottom of the trenches 108. Preferably, carbon 112 is implanted at 20 KeV at a concentration of $10^{14}$ to $10^{15}$ ions/$cm^2$.

Figure 2E:
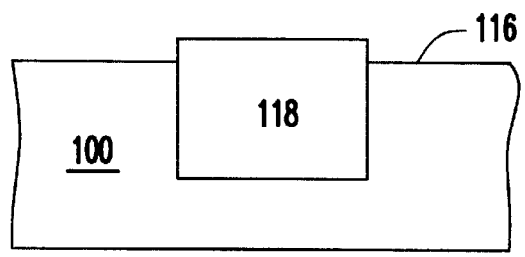

Next, in FIG. 2E the trenches 108 are filled with oxide, preferably using chemical vapor deposition (CVD). Excess CVD oxide above pad nitride layer 104 is removed, using any well known planarization technique such as chemical mechanical polishing. Then, the pad nitride layer 104 and oxide layer 102 are stripped away, reexposing the wafer surface 116 with the CVD oxide 118 in the shallow trenches 108 extending slightly above the surface 116.

Figure 2F:
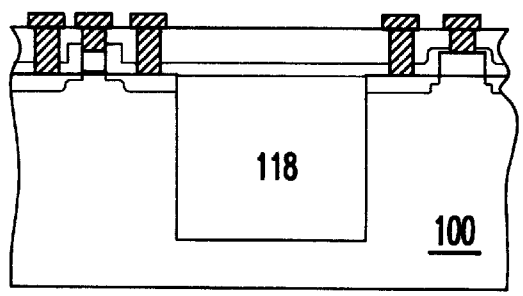

Finally, in FIG. 2F, excess CVD oxide is removed to replanarize the wafer and Field Effect Transistors (FET) are formed on the surface 116 using well known FET formation steps. Typically, formation of FETs requires subsequent oxidations that might otherwise cause compressive stresses in the trenches. However, because the silicon has been implanted with carbon, these extrinsic stresses will not cause the formation of dislocations, particularly at trench corners.

While the invention has been described in terms of preferred embodiments, those skilled in the art will recognize that the invention can be practiced with modification within the spirit and scope of the appended claims.

We claim:

1. A method of relieving extrinsic stress in a patterned semiconductor comprising the steps of:

forming a pad passivation layer on a semiconductor layer;

etching a pattern in said pad passivation layer;

implanting carbon into said pad passivation layer and into said semiconductor layer at said etched passivation layer pattern; and forming features defined by said etched pad passivation layer pattern, wherein the semiconductor layer is a silicon wafer and the pattern is a shallow trench isolation pattern, said method comprising before the step of implanting carbon the steps of:

etching said silicon wafer through said defined shallow trench isolation pattern, trenches being formed to a predetermined depth and having said shallow trench isolation pattern; and forming an oxide layer in said trenches, wherein the carbon is implanted into said silicon wafer in said trenches.

2. The method of claim 1 wherein the step of forming the pad passivation layer comprises the steps of:

growing an oxide layer on said silicon wafer; and forming a nitride layer on said oxide layer.

3. The method of claim 2 wherein the step of forming the features defined by said etched pattern comprises the steps of:

filling said trenches with oxide;

planarizing said oxide;

removing said pad nitride layer; and removing said pad oxide layer.

4. A method of forming an integrated circuit having reduced extrinsic stress as in claim 2, said method further comprising the step of:

forming said integrated circuit, said trenches isolating individual transistors from neighboring transistors.

5. A method of relieving extrinsic stress in a patterned semiconductor comprising the steps of:

forming a pad passivation layer on a semiconductor layer;

etching a pattern in said pad passivation layer;

etching said silicon wafer at said pattern to form a trench, the trench being formed to a predetermined depth;

forming an oxide layer in said trench;

implanting carabon into said pad passivation layer and into said silicon wafer in said trench; and forming features defined by said etched pad passivation layer pattern.

6. The method of claim 5 wherein:

the semiconductor layer is a silicon wafer and the teched pattern is a shallow trench isolation pattern; and the steps of said etching said silicon wafer and said forming said oxide layer is performed before the step of implanting carbon.

7. The method of claim 6, further comprising:

filling said trenches with oxide;

planarizing said oxide;

removing said pad nitride layer, and removing said pad oxide layer.

* * * * *